US012127366B2

(12) United States Patent
Komaranalli et al.

(10) Patent No.: US 12,127,366 B2
(45) Date of Patent: Oct. 22, 2024

(54) FAN MANAGEMENT SYSTEM

(71) Applicant: Dell Products L.P., Round Rock, TX (US)

(72) Inventors: Shivabasava Karibasappa Komaranalli, Round Rock, TX (US); Chandrasekhar Mugunda, Austin, TX (US); Rui An, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 711 days.

(21) Appl. No.: 17/348,405

(22) Filed: Jun. 15, 2021

(65) Prior Publication Data

US 2022/0400573 A1    Dec. 15, 2022

(51) Int. Cl.
*H05K 7/14* (2006.01)
*G05D 23/00* (2006.01)
*G06F 1/20* (2006.01)
*H05K 7/20* (2006.01)

(52) U.S. Cl.
CPC .......... *H05K 7/1498* (2013.01); *G05D 23/00* (2013.01); *G06F 1/20* (2013.01); *H05K 7/20136* (2013.01); *H05K 7/20209* (2013.01); *H05K 7/20718* (2013.01); *H05K 7/20972* (2013.01)

(58) Field of Classification Search
None
See application file for complete search history.

(56) References Cited

U.S. PATENT DOCUMENTS

| | | | |
|---|---|---|---|
| 6,889,908 B2 | 5/2005 | Crippen et al. | |
| 7,483,270 B2* | 1/2009 | Blake | H05K 7/20209 361/679.48 |
| 8,219,362 B2* | 7/2012 | Shrivastava | H05K 7/20836 703/2 |
| 8,233,644 B2* | 7/2012 | DeMoss | H05K 7/20209 700/304 |
| 8,842,433 B2* | 9/2014 | Koblenz | H05K 7/20836 361/679.49 |
| 9,329,586 B2* | 5/2016 | Artman | G05B 15/02 |
| 9,363,928 B2* | 6/2016 | Kondo | H05K 7/20836 |

(Continued)

FOREIGN PATENT DOCUMENTS

WO    WO-2013085819 A1 *  6/2013  .......... G06F 1/1658

*Primary Examiner* — Steven G Snyder
(74) *Attorney, Agent, or Firm* — Joseph Mencher

(57) ABSTRACT

A fan management system includes a chassis housing a storage fan system, a storage system cooled by the storage fan system, computing fan subsystems, and computing devices cooled by respective ones of the computing fan subsystems. Each of the computing devices detects a multi-computing-device configuration that includes the computing devices and, in response, determines a computing device chassis location for that computing device. Each computing device then receives fan inventory information that describes the storage fan system and the computing fan subsystems, distinguishes between the storage fan system and the computing fan subsystems based on the fan inventory information, identifies the computing fan subsystem that is configured to cool that computing device based on the computing device chassis location for that computing device, manages the computing fan subsystem that is configured to cool that computing device, and ignores the others of the computing fan subsystems.

20 Claims, 11 Drawing Sheets

(56) References Cited

U.S. PATENT DOCUMENTS

| | | | |
|---|---|---|---|
| 9,642,286 B1* | 5/2017 | Gutierrez | H05K 7/20736 |
| 9,996,659 B2* | 6/2018 | Shrivastava | G06F 30/18 |
| 10,010,013 B2* | 6/2018 | Shelnutt | H05K 7/20781 |
| 10,064,314 B2* | 8/2018 | Shelnutt | H05K 7/20836 |
| 10,095,205 B2* | 10/2018 | Lovicott | G06F 1/20 |
| 10,146,231 B2* | 12/2018 | Shelnutt | H05K 7/20781 |
| 10,172,262 B2* | 1/2019 | Shelnutt | H05K 7/20781 |
| 10,206,312 B2* | 2/2019 | Shelnutt | H05K 7/2079 |
| 10,614,194 B2* | 4/2020 | Shrivastava | H05K 7/20836 |
| 10,617,042 B2* | 4/2020 | Shelnutt | H05K 7/20772 |
| 10,856,437 B2* | 12/2020 | Chen | G06F 1/3287 |
| 11,064,635 B2* | 7/2021 | Bonnin | H05K 7/20272 |
| 11,585,351 B2* | 2/2023 | Chen | G06F 1/206 |
| 11,729,940 B2* | 8/2023 | Gerdes | G06F 1/3296 |
| | | | 361/695 |
| 2008/0244283 A1* | 10/2008 | Elliott | G06F 1/305 |
| | | | 713/300 |
| 2008/0244311 A1* | 10/2008 | Elliott | G06F 1/305 |
| | | | 714/22 |
| 2009/0304199 A1* | 12/2009 | DeMoss | H05K 7/20209 |
| | | | 381/71.1 |
| 2010/0287018 A1* | 11/2010 | Shrivastava | G06F 30/18 |
| | | | 703/1 |
| 2013/0046514 A1* | 2/2013 | Shrivastava | G06F 30/18 |
| | | | 703/1 |
| 2013/0098599 A1 | 4/2013 | Busch et al. | |
| 2013/0128455 A1* | 5/2013 | Koblenz | H05K 7/20836 |
| | | | 165/294 |
| 2014/0211984 A1* | 7/2014 | Calio | G06Q 10/087 |
| | | | 382/103 |
| 2014/0277750 A1* | 9/2014 | Artman | G05B 15/02 |
| | | | 700/275 |
| 2017/0219239 A1* | 8/2017 | Lovicott | F04D 25/08 |
| 2017/0245399 A1* | 8/2017 | Chou | H05K 7/20136 |
| 2018/0253518 A1* | 9/2018 | Shrivastava | G06F 30/18 |
| 2019/0239385 A1* | 8/2019 | Chen | G06F 1/3221 |
| 2019/0246526 A1* | 8/2019 | Bonnin | H05K 7/20281 |
| 2020/0166977 A1* | 5/2020 | Jayaraman | G06F 1/206 |
| 2020/0293702 A1* | 9/2020 | Shrivastava | G06F 30/18 |
| 2021/0396237 A1* | 12/2021 | Chen | G05B 15/02 |
| 2022/0408590 A1* | 12/2022 | Cheng | G06F 1/20 |
| 2023/0070920 A1* | 3/2023 | Huang | G06F 1/206 |
| 2023/0320041 A1* | 10/2023 | Liu | H05K 7/20172 |
| | | | 361/679.48 |

\* cited by examiner

FAN MANAGEMENT SYSTEM

BACKGROUND

The present disclosure relates generally to information handling systems, and more particularly to managing fans in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server systems, may include a relatively large storage system along with the ability to configure the server system with multiple server devices, and a separate storage fan system and server fan system may be included in the server system in order to ensure proper cooling of the storage system and server devices. For example, the DELL EMC® POWEREDGE® XE7100 available from DELL® EMC® of Hopkinton, Massachusetts, United States and Round Rock, Texas, United States, includes a relatively large storage system (e.g., having a 4U height in the server system chassis) that may be provided with over 100 storage devices, may be configurable with two (or more) server devices (two server devices each having a 1U height and positioned side-by-side in respective server "sleds" in the server system chassis), and is provided with a storage fan system that provides cooling for the storage system, along with a server fan system that includes a respective server fan subsystem that provide cooling for each server device. However, in conventional server systems provided in the multi-server-device configurations discussed above, each of the server devices are configured to manage both the storage fan system and the server fan system, which results in each of the server devices managing both the server fan subsystem that provides it cooling, and the server fan subsystem(s) that provide the other server device(s) cooling. Such situations can cause issues with fan system reporting by the server devices, as a failure event occurring with any particular server fan subsystem may be reported by multiple different server devices, making it difficult to determine the location of that failure event without performing time consuming server device/fan system mapping operations.

Accordingly, it would be desirable to provide fan management system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a fan management engine that is configured to: detect a multi-computing-device configuration that includes a plurality of computing devices in a chassis; determine, in response to detecting the multi-computing-device configuration, a computing device chassis location of a computing device included in the plurality of computing devices and associated with the fan management engine; receive fan inventory information that describes a storage fan system that is configured to cool a storage system in the chassis, and a plurality of computing fan subsystems that are each configured to cool a respective one of the plurality of computing devices; distinguish, based on the fan inventory information, between the storage fan system and the plurality of computing fan subsystems; identify, based on the computing device chassis location of the computing device associated with the fan management engine, the computing fan subsystem in the plurality of computing device subsystems that is configured to cool the computing device associated with the fan management engine; and manage the computing fan subsystem that is configured to cool the computing device associated with the fan management engine and ignore the others of the plurality of computing fan subsystems.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
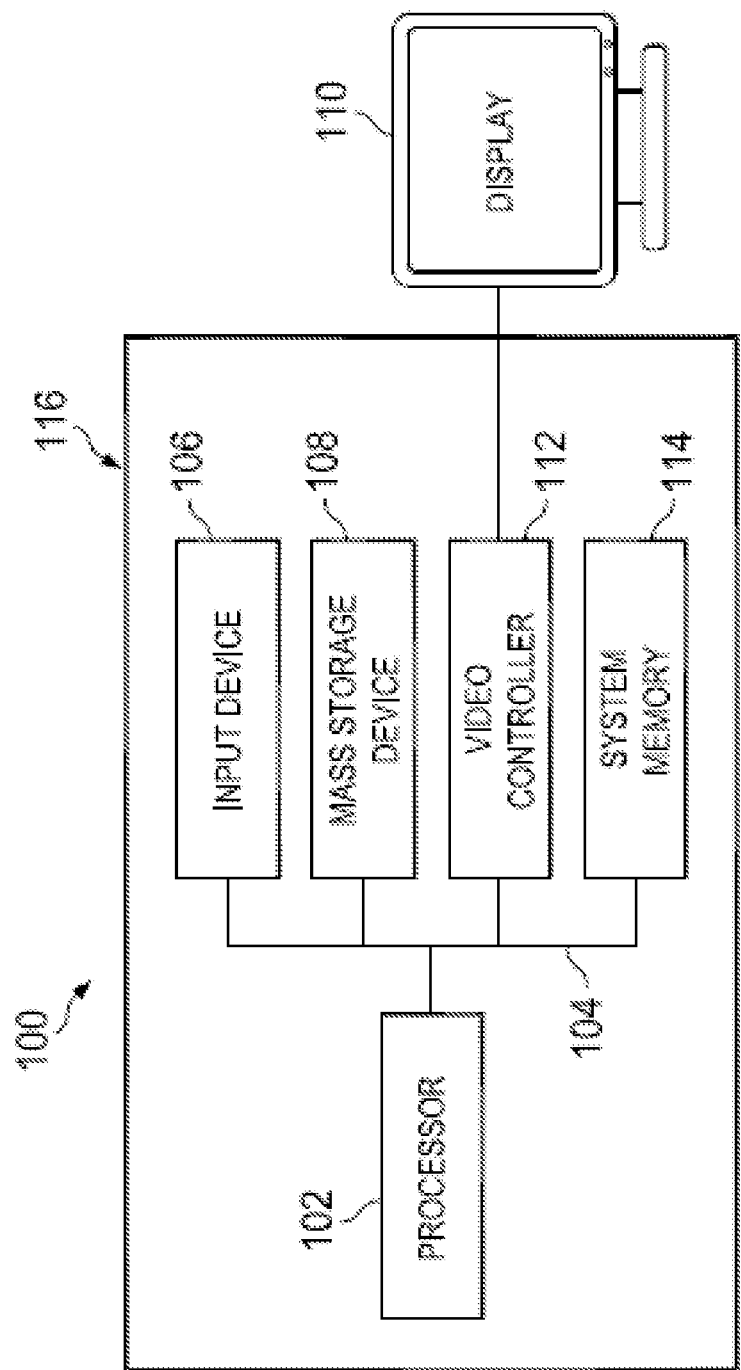
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
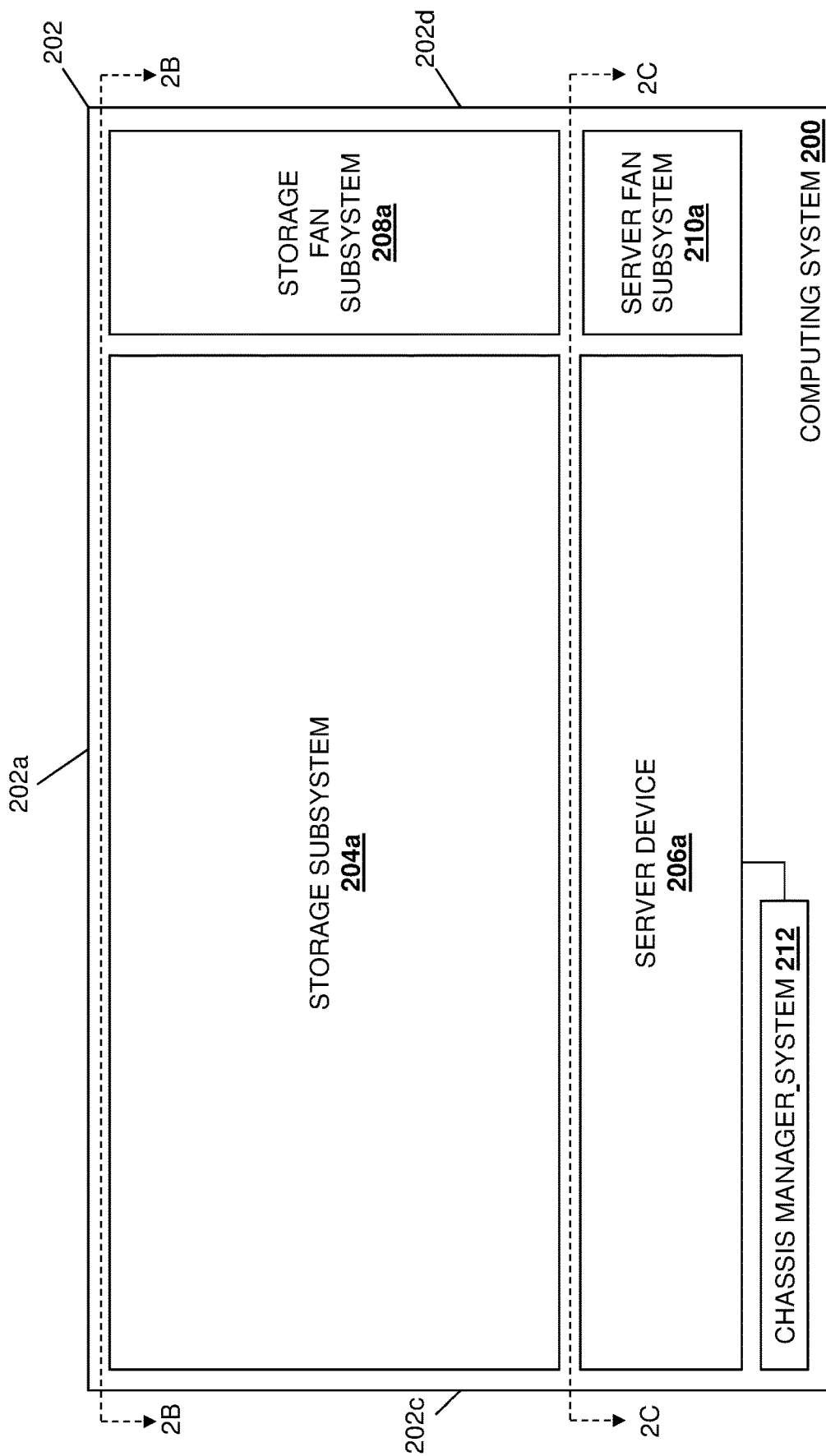
FIG. 2A is a schematic side view illustrating an embodiment of a computing system that may utilize the fan management system of the present disclosure.
Figure 2B:
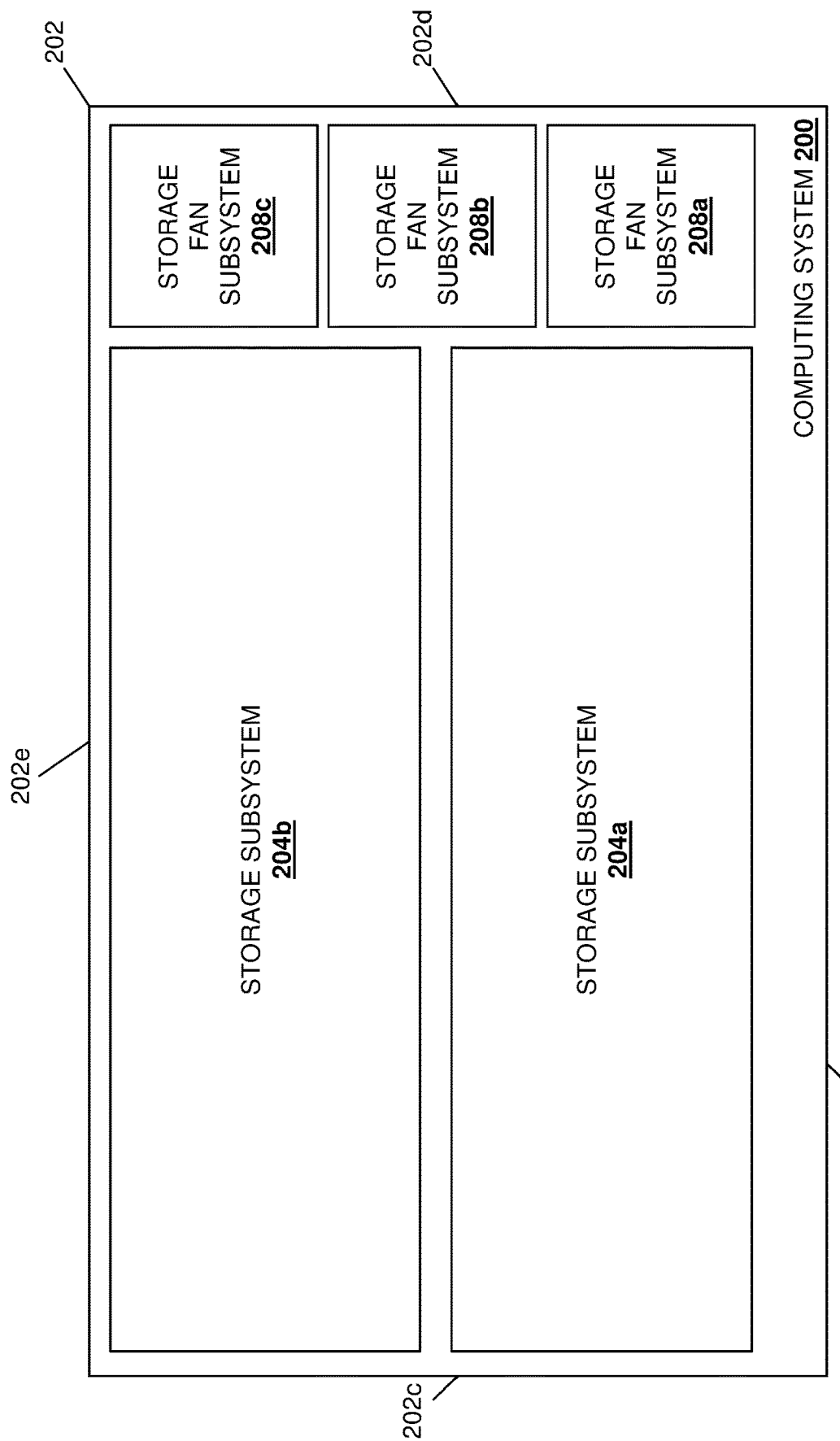
FIG. 2B is a schematic top view illustrating an embodiment of the computing system of FIG. 2A (along line 2B-2B in FIG. 2A) that may utilize the fan management system of the present disclosure.
Figure 2C:
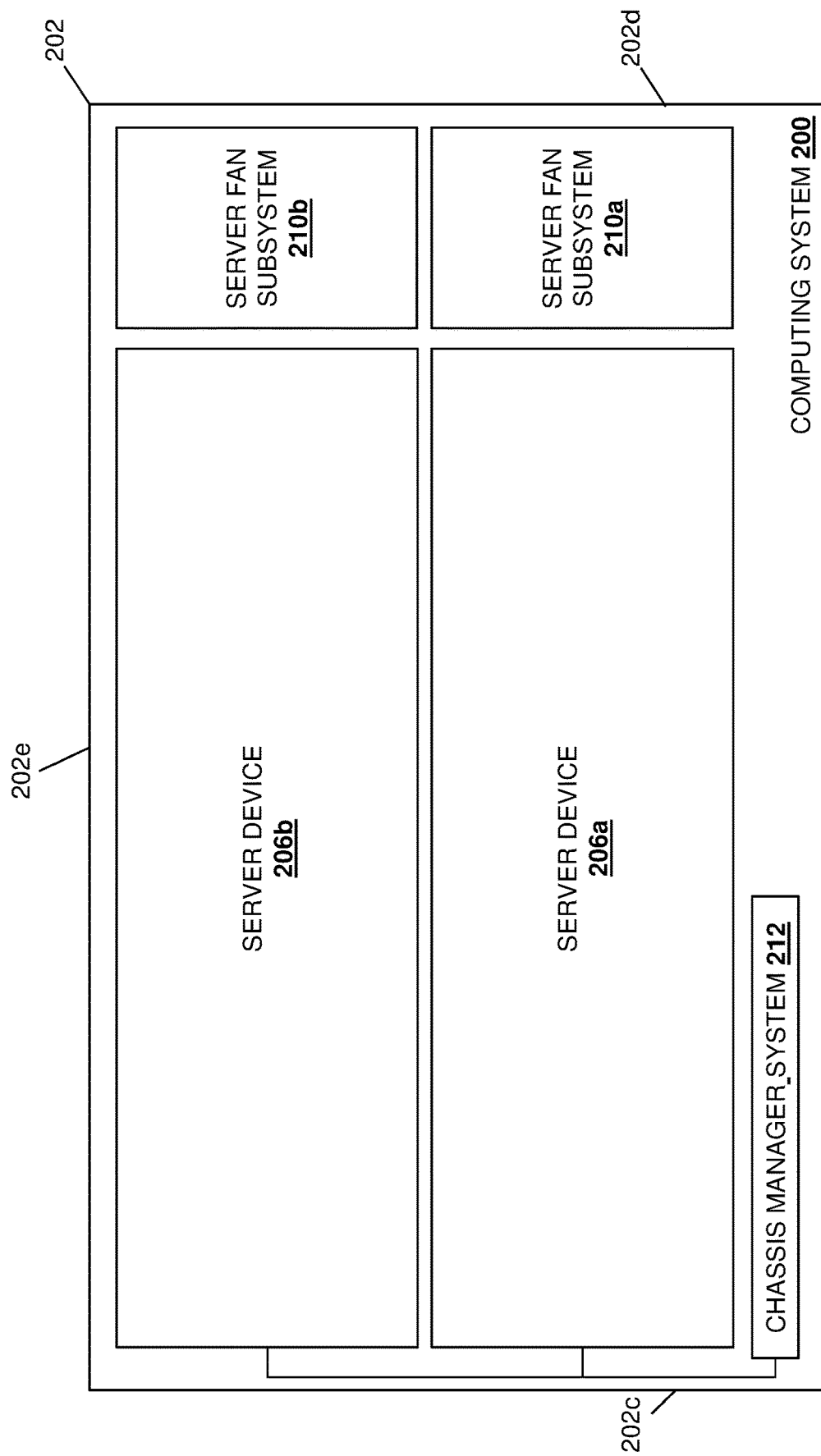
FIG. 2C is a schematic cross-sectional view illustrating an embodiment of the computing system of FIG. 2A (along line 2C-2C in FIG. 2A) that may utilize the fan management system of the present disclosure.

Referring now to FIGS. 2A, 2B, and 2C, an embodiment of a computing system 200 is illustrated that may utilize the fan management system of the present disclosure. In an embodiment, the computing system 200 may be provided by the IHS 100 discussed above with reference to FIG. 1 and/or may include some or all of the components of the IHS 100, and in a specific example, may be provided by a server system such as the DELL EMC® POWEREDGE® XE7100 available from DELL® EMC® of Hopkinton, Massachusetts, United States and Round Rock, Texas, United States. However, while illustrated and discussed as being provided by a particular server system, one of skill in the art in possession of the present disclosure will recognize that the functionality of the computing system 200 discussed below may be provided by other devices that are configured to operate similarly as the computing system 200 discussed below. In the illustrated embodiment, the computing system 200 includes a chassis 202 that houses the components of the computing system 200, only some of which are illustrated below. In the embodiments illustrated and discussed below the chassis includes a top wall 202a, a bottom wall 202b that is located opposite the chassis 202 from the top wall 202a, a front wall 202c that extends between the top wall 202a and the bottom wall 202b, a rear wall 202d that extends between the top wall 202a and the bottom wall 202b and that is located opposite the chassis 202 from the front wall 202c, and a pair of a side walls 202e and 202f that are located opposite the chassis 202 from each other and that extend between the top wall 202a, the bottom wall 202b, the front wall 202c, and the rear wall 202d.

As can be seen from the side view of the computing system 200 illustrated in FIG. 2A, the top view of the computing system 200 in FIG. 2B (viewed from line 2B-2B in FIG. 2A), and the cross-sectional view of the computing system 200 in FIG. 2C (viewed from line 2C-2C in FIG. 2A), the chassis 200 may house a storage system including a storage subsystem 204a and a storage system 204b that are positioned side-by-side in an upper portion of the chassis 202, a server system including a server device 206a and a server device 206b that are positioned side-by-side in a lower portion of the chassis 202 and below the storage system, a storage fan system including storage fan subsystems 208a, 208b, and 208c that are positioned between the storage system and the rear wall 202d of the chassis 202, and a server fan system including server fan subsystems 210a and 210b that are positioned between the server system and the rear wall 202d of the chassis 202. The chassis 202 may also house chassis manager system 212 that is coupled to each of the server devices 206a and 206b, and that may be provided by any of a variety of chassis manager devices/systems known in the art. However, while a storage system and a specific computing system (e.g., provided by server devices) are illustrated and described, one of skill in the art in possession of the present disclosure will appreciate that systems other than storage systems and computing systems may benefit from the teachings of the present disclosure and thus will fall within its scope as well.

In a specific example in which the computing system 200 is provided by the DELL EMC® POWEREDGE® XE7100 available from DELL® EMC® of Hopkinton, Massachusetts, United States and Round Rock, Texas, United States, the storage subsystems 204a and 204b in the storage system may each be configured to provide access to up to 50 storage devices (e.g., Hard Disk Drives (HDDs)) for each of the server devices 206a and 206b, with each of the storage subsystems 208a, 208b, and 208c including a pair of storage fan devices positioned in series and configured to produce an airflow from outside of the chassis 202 adjacent the rear wall 202d and over the storage subsystems 204a and 204b. As discussed above, the storage system provided by the storage subsystems 204a and 204b may occupy a 4U height space in the chassis 202, although other storage system space requirements will fall within the scope of the present disclosure as well.

Furthermore, the server devices 206a and 206b may be provided in server "sleds" that include any server device components that provide the server devices 206a and 206b, expander modules, and/or any other computing components that would be apparent to one of skill in the art in possession of the present disclosure. Each of the server fan subsystems 210a and 210b may be provided in a respective server "sled" and may include two rows of three server fan devices each that provide three pairs of server fan devices positioned side-by-side (with each pair of server fan devices in series) and configured to produce an airflow from outside of the chassis 202 adjacent the rear wall 202d and over the server devices 206a and 206b. As discussed above, the server system provided by the server subsystems 206a and 206b may occupy a 1U height space in the chassis 202, although other server system space requirements will fall within the scope of the present disclosure as well. However, while a specific example of a server system with two server devices is illustrated and described, one of skill in the art in possession of the present disclosure will appreciate how more server devices (or other computing devices) may perform the fan management functionality discussed below while remaining within the scope of the present disclosure as well.

Figure 3:
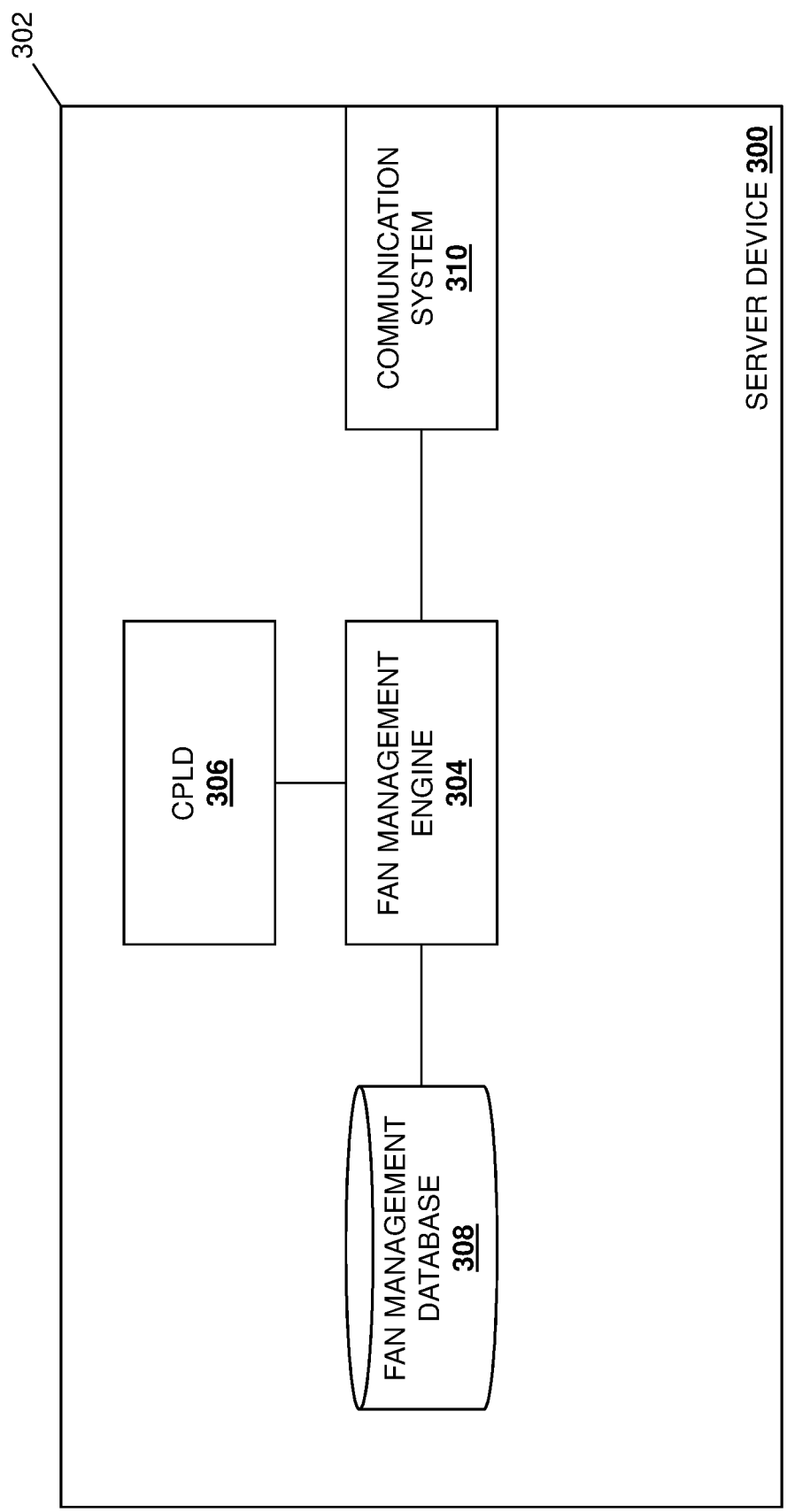
FIG. 3 is a schematic view illustrating an embodiment of a server device that may be provided in the computing system of FIGS. 2A-2C.

Referring now to FIG. 3, an embodiment of a server device 300 is illustrated that may provide either of the server devices 206a and 206b discussed above with reference to FIGS. 2A-2C. As such, the server device 300 may be provided by the IHS 100 discussed above with reference to FIG. 1 and/or may include some or all of the components of the IHS 100, and in specific examples may include server device components, expander modules, and/or other computing components known in the art. Furthermore, while illustrated and discussed as being provided by server devices, one of skill in the art in possession of the present disclosure will recognize that the functionality of the server device 300 discussed below may be provided by other devices that are configured to operate similarly as the server device 300 discussed below. In the illustrated embodiment, the server device 300 includes a chassis 302 (e.g., the server "sled" discussed above) that houses the components of the server device 300 (and the server fan subsystem as discussed above), only some of which are illustrated and discussed below.

For example, the chassis 302 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a fan management engine 304 that is configured to perform the functionality of the fan management engines and/or server devices discussed below. In a specific example, the fan management engine 304 may be implemented via an Application Programming Interface (API) that allows the fan management functionality discussed below to be performed across an Intelligent Platform Management Interface (IPMI), a Graphical User Interface (GUI), a Remote Access Controller Admin (RACADM) interface, and/or any of a variety of other interfaces that would be apparent to one of skill in the art in possession of the present disclosure.

In a specific example, the fan management engine 304 may be included in a remote access controller device such as the integrated DELL® Remote Access Controller (iDRAC) available in server devices such as those available from DELL EMC® discussed above, and/or other Baseboard Management Controller (BMC)/remote access controller devices known in the art. As such, the server device 300 may include a remote access controller device that is configured to perform any of a variety of management functionality known in the art for the server device 300, as well as the fan management functionality discussed below. However, while the fan management functionality is discussed as being provided by a respective remote access controller device in each server device 300, one of skill in the art in possession of the present disclosure will appreciate how the fan management functionality described herein may be provided by a variety of other subsystems and in a variety of other manners that will fall within the scope of the present disclosure as well.

The chassis 302 may also house a Complex Programmable Logic Device (CPLD) 306 that may store the server system configurations, server device locations, and/or any other information described below. In the specific examples below, the CPLD 306 includes a register subsystem having the following structure:

| MB CPLD SPIX Map | |
| --- | --- |
| Register | Name |
| 0xCA.0 | Server Sled Position ID0 |
| 0xCA.1 | Server Sled Position ID1 |
| 0xCA.2 | Server System Configuration: Single Server: 0 Dual Server: 1 |

However, while described as being stored in a specific structure in a CPLD for a server system that is limited to a single server or a dual server configuration, one of skill in the art in possession of the present disclosure will appreciate how the information utilized to provide the fan management functionality discussed below may be stored in a variety of devices and/or in a variety of manners (including in a register subsystem configured for a server system with more than two server devices) that will fall within the scope of the present disclosure as well. The chassis 302 may also house a storage system (not illustrated, but which may include the storage 108 discussed above with reference to FIG. 1) that is coupled to the fan management engine 304 (e.g., via a coupling between the storage system and the processing system) and that includes a fan management database 308 that is configured to store any of the information utilized by the fan management engine 304 discussed below.

The chassis 302 may also house a communication system 310 that is coupled to the fan management engine 304 (e.g., via a coupling between the communication system 310 and the processing system) and that may be provided by a Network Interface Controller (NIC), wireless communication systems (e.g., BLUETOOTH®, Near Field Communication (NFC) components, WiFi components, cellular components, etc.), and/or any other communication components that would be apparent to one of skill in the art in possession of the present disclosure. However, while a specific server device 300 has been illustrated and described, one of skill in the art in possession of the present disclosure will recognize that server devices (or other devices operating according to the teachings of the present disclosure in a manner similar to that described below for the server device 300) may include a variety of components and/or component configurations for providing conventional server device functionality, as well as the functionality discussed below, while remaining within the scope of the present disclosure as well.

Figure 4:
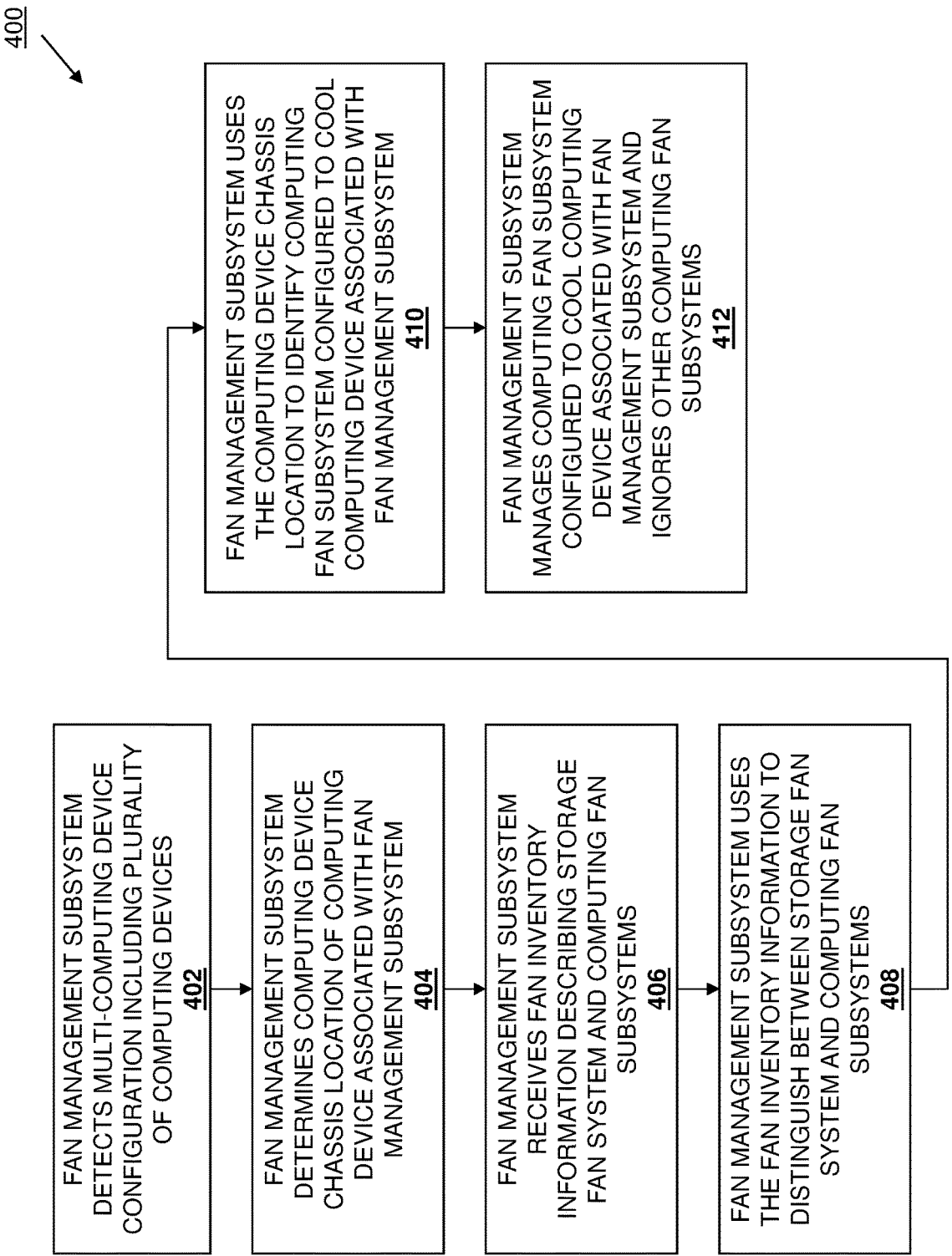
FIG. 4 is a flow chart illustrating an embodiment of a method for managing fans.

Referring now to FIG. 4, an embodiment of a method 400 for managing fans is illustrated. As discussed below, the systems and methods of the present disclosure provide for the configuration of devices in a multi-device configuration to each report a common/shared fan system and a fan subsystem that is configured to cool that device, which allows management operations (e.g., the reporting of fan failure events) to be performed in a manner that allows the fan subsystems that cool devices to be distinguished from each other. For example, the fan management system of the present disclosure may include a chassis housing a storage fan system, a storage system cooled by the storage fan system, computing fan subsystems, and computing devices cooled by respective ones of the computing fan subsystems. Each of the computing devices detects a multi-computing-device configuration that includes the computing devices and, in response, determines a computing device chassis location for that computing device. Each computing device then receives fan inventory information that describes the storage fan system and the computing fan subsystems, distinguishes between the storage fan system and the computing fan subsystems based on the fan inventory information, identifies the computing fan subsystem that is configured to cool that computing device based on the computing device chassis location for that computing device, manages the computing fan subsystem that is configured to cool that computing device, and ignores the others of the computing fan subsystems. As such, issues with fan system reporting by the computing devices in conventional systems are eliminated, as a failure event occurring with any particular computing fan subsystem will only be reported by the computing device cooled by that computing fan subsystem, allowing for the determination of the location of that failure event without performing time consuming computing device/fan system mapping operations required in conventional systems.

Figure 5A:
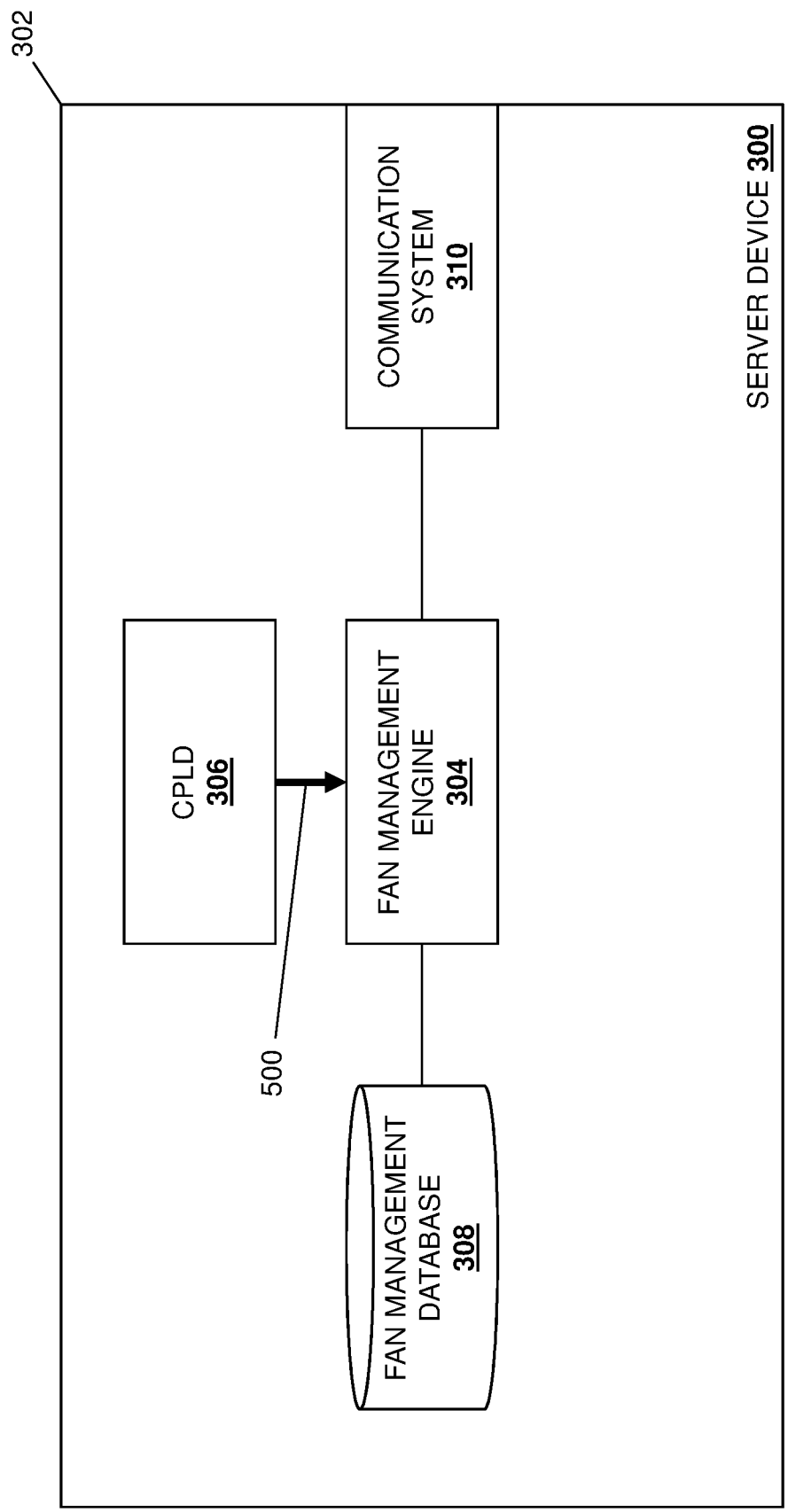
FIG. 5A is a schematic view illustrating an embodiment of the server device of FIG. 3 operating during the method of FIG. 4.

The method 400 begins at block 402 where a fan management subsystem detects a multi-computing device configuration including a plurality of computing devices. As illustrated in FIG. 5A, in an embodiment at block 402, the fan management engine 304 in each of the server devices 206a/300 and 206b/300 may perform multi-computing device configuration detection operations 500 that include accessing the CPLD 306 and reading the register subsystem in the CPLD 306 that identifies that the multiple server devices 206a/300 and 206b/300 are located in the chassis 202. As will be appreciated by one of skill in the art in possession of the present disclosure, the register subsystem in the CPLD 306 may be set with the server device configuration of the computing system 200, and that register subsystem in the CPLD 306 may be read by the fan management engine 304 in each of the server devices 206a/300 and 206b/300 (as well as any other server devices in the chassis 202 in other embodiments) to detect when other server devices are included in the chassis 202 to provide a multi-computing device configuration. Using the specific example of the register subsystem in the CPLD 306 discussed above, the 0xCA.2 register (e.g., bit 2 in the register subsystem) of the CPLD 306 may be set to indicate a dual-server/multi-computing-device configuration (and one of skill in the art in possession of the present disclosure will recognize that if the 0xCA.2 register of the CPLD 306 is not set that will indicate a single-server/single-computing-device configuration).

Figure 5B:
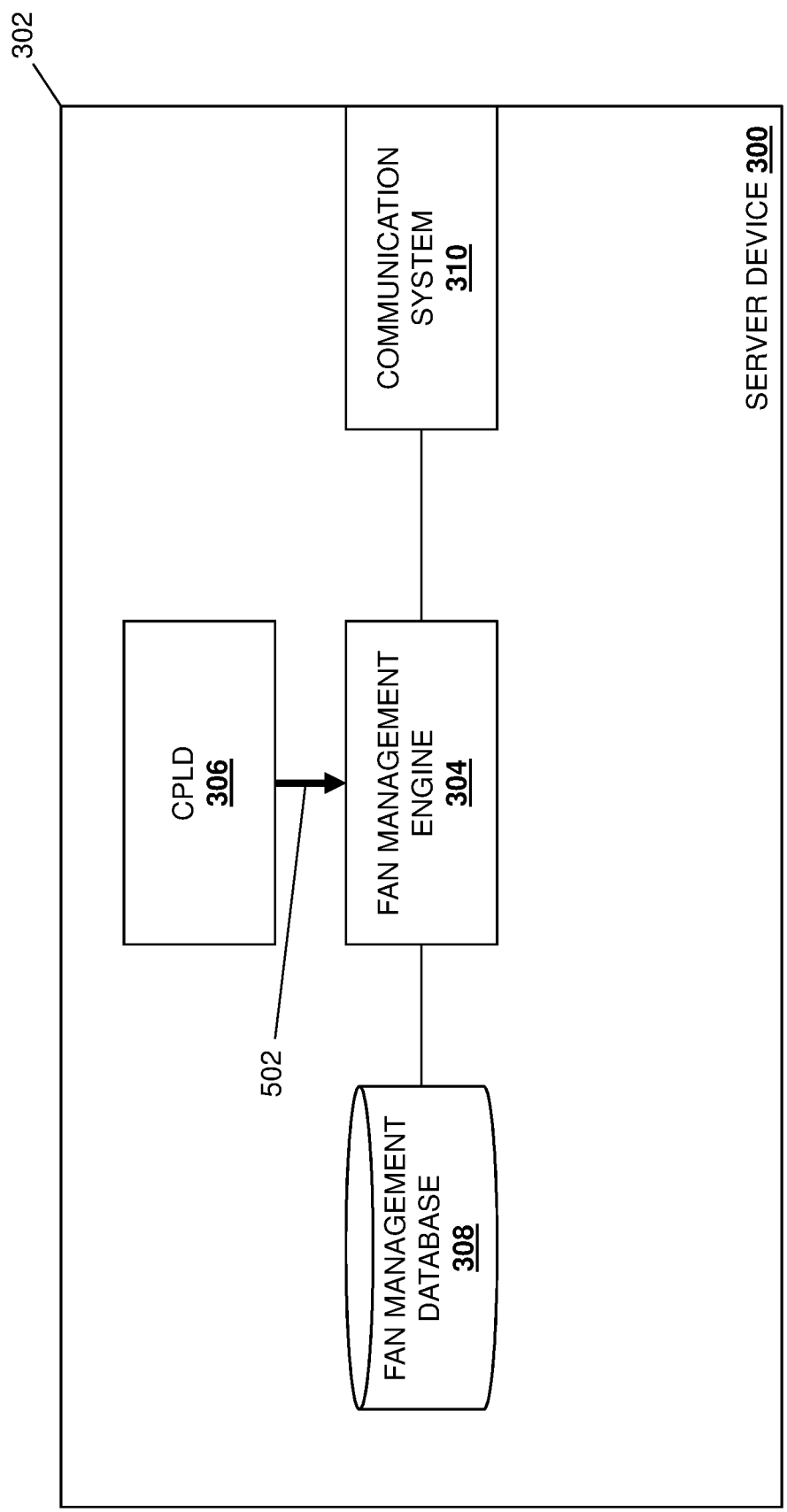
FIG. 5B is a schematic view illustrating an embodiment of the server device of FIG. 3 operating during the method of FIG. 4.

The method 400 then proceeds to block 404 where the fan management subsystem determines a computing device chassis location of a computing device associated with the fan management subsystem. As illustrated in FIG. 5B, in an embodiment at block 404, the fan management engine 304 in each of the server devices 206a/300 and 206b/300 may perform computing device chassis location determination operations 502 that include accessing the CPLD 306 and reading the register subsystem in the CPLD 306 that identifies the server device location of that server device in the chassis 202. As will be appreciated by one of skill in the art in possession of the present disclosure, the register subsystem in the CPLD 306 may be set with a location of a server device, and that register subsystem in the CPLD 306 may be read by the fan management engine 304 in each of the server devices 206a/300 and 206b/300 (as well as any other server devices in the chassis 202 in other embodiments) to determine the server device location of that server device in the chassis 202 (e.g., "server sled 1", "server sled 2", and up to "server sled N"). Using the specific example of the register subsystem in the CPLD 306 discussed above, the 0xCA.0 register (e.g., bit 0 in the register subsystem) of the CPLD 306 may be set to indicate a server device is in the "server sled 1" position in the chassis 202, and the 0xCA.1 register (e.g., bit 1 in the register subsystem) of the CPLD 306 may be set to indicate a server device is in the "server sled 2" position in the chassis 202.

Figure 5C:
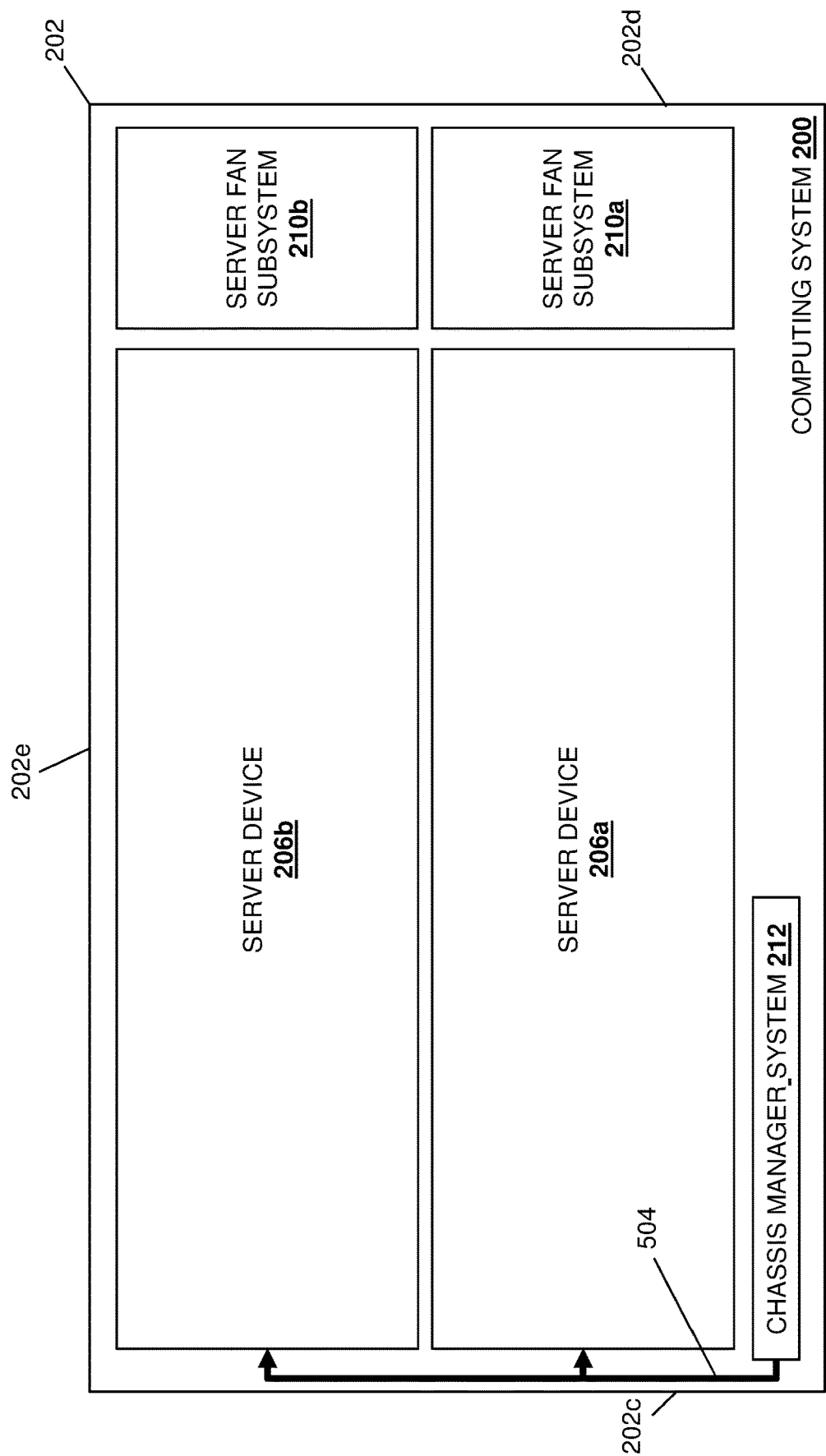
FIG. 5C is a schematic view illustrating an embodiment of the computing system of FIGS. 2A-2C operating during the method of FIG. 4.

The method 400 then proceeds to block 406 where the fan management subsystem receives fan inventory information describing a storage fan system and computing fan subsystems. With reference to FIG. 5C, in an embodiment of block 406, the chassis management system 212 may perform fan inventory information reporting operations 504 that include generating and transmitting fan inventory information to each of the server devices 206a and 206b. For example, the chassis management system 212 may generate "SetSensorinfo" Intelligent Platform Management Interface (IPMI) commands that identify the storage fan subsystems 208a, 208b, and 208c in the storage fan system by their storage fan device type (e.g., "storage/type 1 fan devices"), and the server fan subsystems 210a and 210b in the server fan system by their server fan type (e.g., "server/type 2 fan devices"), and may then transmit those IMPI commands using a Satellite Controller-Baseboard Management Controller (SC-BMC) communication protocol to each of the server devices 206a and 206b.

Figure 5D:
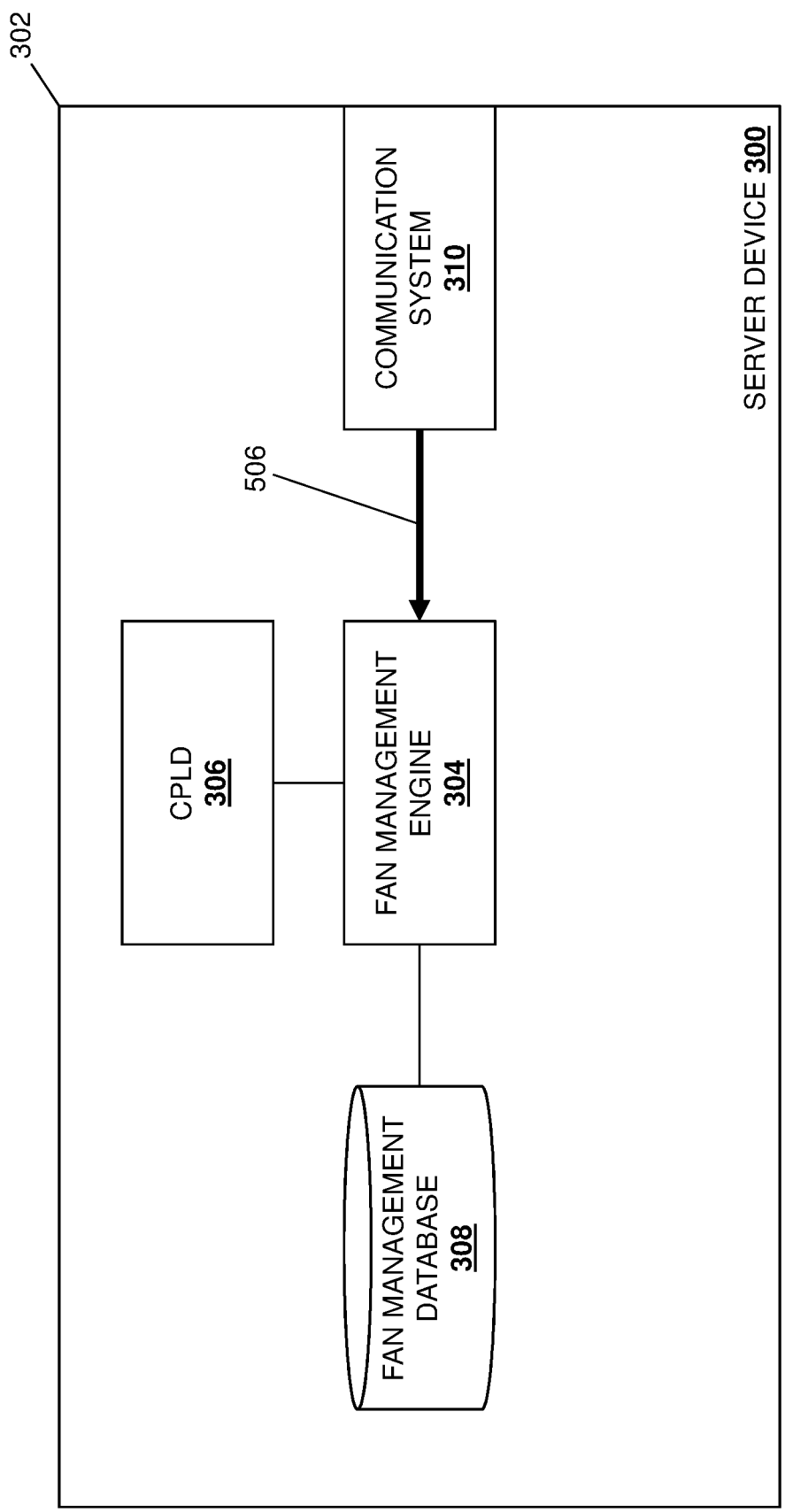
FIG. 5D is a schematic view illustrating an embodiment of the server device of FIG. 3 operating during the method of FIG. 4.

As will be appreciated by one of skill in the art in possession of the present disclosure, the fan device type differences may be identified in the fan inventory information generated by the chassis manager system 212 at block 406 in any of a variety of manners (e.g., type 1/storage fans and type 2/server fans). However, while particular fan inventory information is discussed as being generated and transmitted below, one of skill in the art in possession of the present disclosure will appreciate how other fan inventory information may be generated and transmitted while remaining within the scope of the present disclosure as well. As illustrated in FIG. 5D, in an embodiment at block 406, the fan management engine 304 in each of the server devices 206a/300 and 206b/300 may perform fan inventory information receiving operations 506 that include receiving the fan inventory information via its communication system 310 from the chassis manager system 212. As such, at block 406, the fan management engine 304 in each of the server devices 206a/300 and 206b/300 may receive fan inventory information that identifies the entire chassis fan system configuration that includes the storage fan subsystems 208a-208c and the server fan subsystems 210a and 210b.

The method 400 then proceeds to block 408 where the fan management subsystem uses the fan inventory information to distinguish between the storage fan system and the computing fan subsystems. In an embodiment, at block 408, the fan management engine 304 in each of the server devices 206a/300 and 206b/300 (as well as any other server devices in the chassis 202 in other embodiments) may perform storage/server fan system distinguishing operations that distinguish between the storage fan subsystems 208a-208c and the server fan subsystems 210a and 210b based on the storage fan device type of each storage fan device in the storage fan subsystems 208a-208c in the storage fan system identified in the fan inventory information, and the server fan device type of each server fan device in the server fan subsystems 210a and 210b in the server fan system identified in the fan inventory information.

As discussed above, the storage fan subsystems 208a-208c in the storage fan system and the server fan subsystems 210a and 210b in the server fan system may include different type fan devices (e.g., storage/type 1 fan device types vs. server/type 2 fan device types), and thus the fan device type information included in the fan inventory information may be utilized by the fan management engine 304 in each of the server devices 206a/300 and 206b/300 (as well as any other server devices in the chassis 202 in other embodiments) to distinguish between the storage fan subsystems 208a-208c in the storage fan system and the server fan subsystems 210a and 210b in the server fan system. However, while fan device types are described as being used to distinguish between the different fan systems in the chassis 202, one of skill in the art in possession of the present disclosure will appreciate how other fan inventory information may be utilized to distinguish between different fan systems in a chassis while remaining within the scope of the present disclosure as well.

Figure 5E:
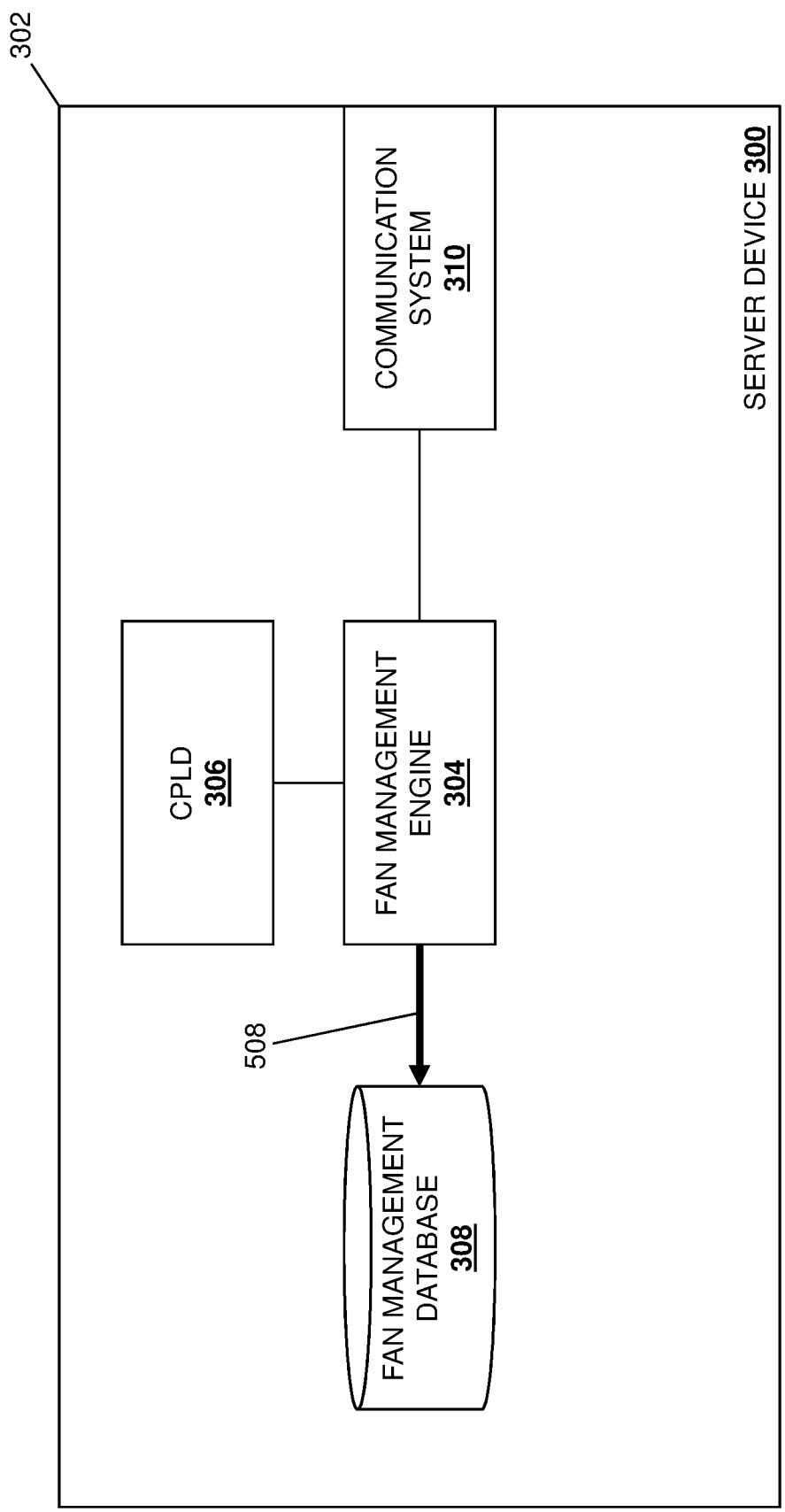
FIG. 5E is a schematic view illustrating an embodiment of the server device of FIG. 3 operating during the method of FIG. 4.

The method 400 then proceeds to lock 410 where the fan management subsystem uses the computing device chassis location to identify a computing fan subsystem that is configured to cool the computing device associated with the fan management subsystem. In an embodiment, at block 410, the fan management engine 304 in each of the server devices 206a/300 and 206b/300 (as well as any other server devices in the chassis 202 in other embodiments) may perform server fan subsystem identification operations that identify the server fan subsystem that is configured to cool its server device based on the server device chassis location of that server device. As will be appreciated by one of skill in the art in possession of the present disclosure, the server fan subsystem 210a is positioned in the chassis 202 such that it is configured to cool the server device 206a, and the server fan subsystem 210b is positioned in the chassis 202 such that it is configured to cool the server device 206b, and the server device chassis location of the server device 206a may be utilized by the fan management engine 304 in the server device 206a/300 to identify that the server fan subsystem 210a (e.g., server fan devices 1-6) is configured to cool the server device 206a, while the server device chassis location of the server device 206b may be utilized by the fan management engine 304 in the server device 206b/300 to identify that the server fan subsystem 210b (e.g., server fan devices 7-12) is configured to cool the server device 206b The method 400 then proceeds to block 412 where the fan management subsystem manages the computing fan subsystem that is configured to cool the computing device associated with the fan management subsystem and ignores the other computing fan subsystems. With reference to FIG. 5E, in an embodiment of block 412, the fan management engine 304 in each of the server devices 206a/300 and 206b/300 (as well as any other server devices in the chassis 202 in other embodiments) may perform computing fan subsystem management operations 508 that may include enabling and disabling fan device sensors in its fan management database 308. For example, the fan management engine 304 in the server device 206a/300 may manage the server fan subsystem 210a that is configured to cool the server device 206a and ignore the server fan subsystem 210b that is configured to cool the server device 206b by enabling first Intelligent Platform Management Interface (IPMI) sensors for the server fan subsystem 210a that is configured to cool the server device 206a and disabling second IPMI sensors for the server fan subsystem 210b that is configured to cool the server device 206b. As will be appreciated by one of skill in the art in possession of the present disclosure, the fan management engine 304 in the server device 206a/300 may also enable IPMI sensors for the storage fan subsystems 208a-208c in the storage fan system in order to manage the storage fan subsystems 208a-208c in the storage fan system.

Similarly, the fan management engine 304 in the server device 206b/300 may manage the server fan subsystem 210b that is configured to cool the server device 206b and ignore the server fan subsystem 210a that is configured to cool the server device 206a by enabling first Intelligent Platform Management Interface (IPMI) sensors for the server fan subsystem 210b that is configured to cool the server device 206b and disabling second IPMI sensors for the server fan subsystem 210a that is configured to cool the server device 206a. As will be appreciated by one of skill in the art in possession of the present disclosure, the fan management engine 304 in the server device 206b/300 may also enable IPMI sensors for the storage fan subsystems 208a-208c in the storage fan system in order to manage the storage fan subsystems 208a-208c in the storage fan system.

As such, following block 412, the fan management engine 304 in each of the server devices 206a/300 and 206b/300 may manage the storage fan subsystems 208a-208c in the storage fan system and the computing fan subsystem that is configured to cool its server device. For example, the fan management engine 304 in the server device 206a/300 may report Rotations Per Minute (RPM) readings for the storage fan devices in the storage fan subsystems 208a-208c in the storage fan system and the server fan subsystem 210a in the server fan system (while ignoring the server fan subsystem 210b in the server fan system), log System Event Log (SEL) events (e.g., fan failure SEL events) for the storage fan devices in the storage fan subsystems 208a-208c in the storage fan system and the server fan subsystem 210a in the server fan system (while ignoring the server fan subsystem 210b in the server fan system), and/or perform any other fan management operations that would be apparent to one of skill in the art in possession of the present disclosure.

Similarly, the fan management engine 304 in the server device 206b/300 may report Rotations Per Minute (RPM) readings for the storage fan devices in the storage fan subsystems 208a-208c in the storage fan system and the server fan subsystem 210b in the server fan system (while ignoring the server fan subsystem 210a in the server fan system), log SEL events (e.g., fan failure SEL events) for the storage fan devices in the storage fan subsystems 208a-208c in the storage fan system and the server fan subsystem 210b in the server fan system (while ignoring the server fan subsystem 210a in the server fan system), and/or perform any other fan management operations that would be apparent to one of skill in the art in possession of the present disclosure.

Thus, systems and methods have been described that provide for the configuration of server devices in a multi-server-configuration to each report a common/shared storage fan system and a server fan subsystem that is configured to cool that server device, which allows management operations (e.g., the reporting of fan failure events) to be performed in a manner that allows the fan subsystems that cool server devices to be distinguished from each other. For example, the fan management system of the present disclosure may include a chassis housing a storage fan system, a storage system cooled by the storage fan system, server fan subsystems, and server devices cooled by respective ones of the server fan subsystems. Each of the server devices detects a multi-server-device configuration that includes the server devices and, in response, determines a server device chassis location for that server device. Each server device then receives fan inventory information that describes the storage fan system and the server fan subsystems, distinguishes between the storage fan system and the server fan subsystems based on the fan inventory information, identifies the server fan subsystem that is configured to cool that server device based on the server device chassis location for that server device, manages the server fan subsystem that is configured to cool that server device, and ignores the others of the server fan subsystems. As such, issues with fan system reporting by the server devices in conventional server systems are eliminated, as a failure event occurring with any particular server fan subsystem will only be reported by the server device cooled by that server fan subsystem, allowing for the determination of the location of that failure event without performing time consuming server device/fan system mapping operations required in conventional server systems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A fan management system, comprising:
a chassis;
a storage fan system included in the chassis;
a storage system that is included in the chassis and that is configured to be cooled by the storage fan system;
a plurality of computing fan subsystems that are included in the chassis; and
a plurality of computing devices that are included in the chassis and that are each configured to be cooled by a respective one of the plurality of computing fan subsystems, wherein each of the plurality of computing devices is configured to:
detect a multi-computing-device configuration that includes the plurality of computing devices;
determine, in response to detecting the multi-computing-device configuration, a computing device chassis location for that computing device;
receive fan inventory information that describes the storage fan system and the plurality of computing fan subsystems;
distinguish, based on the fan inventory information, between the storage fan system and the plurality of computing fan subsystems;
identify, based on the computing device chassis location for that computing device, the computing fan subsystem in the plurality of computing fan subsystems that is configured to cool that computing device; and
manage the computing fan subsystem in the plurality of computing fan subsystems that is configured to cool that computing device and ignore the others of the plurality of computing fan subsystems.

2. The system of claim 1, further comprising:
a Complex Programmable Logic Device (CPLD) included in the chassis, wherein each of the plurality of computing devices is configured to detect the multi-computing-device configuration by accessing the CPLD.

3. The system of claim 1, further comprising:
a Complex Programmable Logic Device (CPLD) included in the chassis, wherein each of the plurality of computing devices is configured to determine the computing device chassis location for that computing device by accessing the CPLD.

4. The system of claim 1, further comprising:
a chassis manager system included in the chassis, wherein each of the plurality of computing devices is configured to receive the fan inventory information from the chassis manager system.

5. The system of claim 1, wherein the fan inventory information includes a storage fan device type of each storage fan device in the storage fan system and a computing fan device type of each computing fan device in the computing fan system, and wherein each of the plurality of computing devices is configured to:
distinguish between the storage fan system and the plurality of computing fan subsystems based on the storage fan device type of each storage fan device in the storage fan system and the computing fan device type of each computing fan device in the computing fan system.

6. The system of claim 1, wherein each of the plurality of computing devices is configured to manage the computing fan subsystem in the plurality of computing fan subsystems that is configured to cool that computing device and ignore the others of the plurality of computing fan subsystems by enabling first Intelligent Platform Management Interface (IPMI) sensors for the computing fan subsystem in the plurality of computing fan subsystems that is configured to cool that computing device and disabling second IPMI sensors for the others of the plurality of computing fan subsystems.

7. An Information Handling System (IHS), comprising:
a processing system; and
a memory system that is coupled to the processing system and that includes instructions that, when executed by the processing system, cause the processing system to provide a fan management engine that is configured to:
detect a multi-computing-device configuration that includes a plurality of computing devices in a chassis;
determine, in response to detecting the multi-computing-device configuration, a computing device chassis location of a computing device included in the plurality of computing devices and associated with the fan management engine;
receive fan inventory information that describes a storage fan system that is configured to cool a storage system in the chassis, and a plurality of computing fan subsystems that are each configured to cool a respective one of the plurality of computing devices;
distinguish, based on the fan inventory information, between the storage fan system and the plurality of computing fan subsystems;
identify, based on the computing device chassis location of the computing device associated with the fan management engine, the computing fan subsystem in the plurality of computing device fan subsystems that is configured to cool the computing device associated with the fan management engine; and
report, to a chassis manager system that is coupled to each of the plurality computing devices, only failure events occurring in the computing fan subsystem that is configured to cool the computing device associated with the fan management engine while ignoring failure events occurring in the others of the plurality of computing fan subsystems.

8. The IHS of claim 7, wherein the fan management engine is configured to detect the multi-computing-device configuration by accessing a Complex Programmable Logic Device (CPLD).

9. The IHS of claim 7, wherein the fan management engine is configured to determine the computing device chassis location of the computing device associated with the fan management engine by accessing a Complex Programmable Logic Device (CPLD).

10. The IHS of claim 7, wherein the fan management engine is configured to receive the fan inventory information from a chassis manager system.

11. The IHS of claim 7, wherein the fan inventory information includes a storage fan device type of each storage fan device in the storage fan system and a computing fan device type of each computing fan device in the computing fan system, and wherein the fan management engine is configured to:
distinguish between the storage fan system and the plurality of computing fan subsystems based on the storage fan device type of each storage fan device in the storage fan system and the computing fan device type of each computing fan device in the computing fan system.

12. The IHS of claim 7, wherein the fan management engine is configured to manage the computing fan subsystem that is configured to cool the computing device associated with the fan management engine and ignore the others of the plurality of computing fan subsystems by enabling first Intelligent Platform Management Interface (IPMI) sensors for the computing fan subsystem that is configured to cool the computing device associated with the fan management engine and disabling second IPMI sensors for the others of the plurality of computing fan subsystems.

13. The IHS of claim 7, wherein the fan management engine is provided by a remote access controller device that is included in the computing device associated with the fan management engine.

14. A method for managing fans, comprising:
detecting, by a fan management subsystem, a multi-computing-device configuration that includes a plurality of computing devices in a chassis;
determining, by the fan management subsystem in response to detecting the multi-computing-device configuration, a computing device chassis location of a computing device included in the plurality of computing devices and associated with the fan management subsystem;
receiving, by the fan management subsystem, fan inventory information that describes a storage fan system that is configured to cool a storage system in the chassis, and a plurality of computing fan subsystems that are each configured to cool a respective one of the plurality of computing devices;
distinguishing, by the fan management subsystem based on the fan inventory information, between the storage fan system and the plurality of computing fan subsystems;
identifying, by the fan management subsystem based on the computing device chassis location of the computing device associated with the fan management engine, the computing fan subsystem in the plurality of computing device fan subsystems that is configured to cool the computing device associated with the fan management subsystem; and
reporting, by the fan management subsystem to a chassis manager system that is coupled to each of the plurality of computing devices, only failure events occurring in the computing fan subsystem that is configured to cool the computing device associated with the fan management subsystem while ignoring failure events occurring in the others of the plurality of computing fan subsystems.

15. The method of claim 14, wherein the fan management subsystem detects the multi-computing-device configuration by accessing a Complex Programmable Logic Device (CPLD).

16. The method of claim 14, wherein the fan management subsystem determines the computing device chassis location of the computing device associated with the fan management subsystem by accessing a Complex Programmable Logic Device (CPLD).

17. The method of claim 14, wherein the fan management subsystem receives the fan inventory information from a chassis manager system.

18. The method of claim 14, wherein the fan inventory information includes a storage fan device type of each storage fan device in the storage fan system and a computing fan device type of each computing fan device in the computing fan system, and wherein the fan management subsystem distinguishes between the storage fan system and the plurality of computing fan subsystems based on the storage fan device type of each storage fan device in the storage fan system and the computing fan device type of each computing fan device in the computing fan system.

19. The method of claim 14, wherein the fan management subsystem manages the computing fan subsystem that is configured to cool the computing device associated with the fan management subsystem and ignores the others of the plurality of computing fan subsystems by enabling first Intelligent Platform Management Interface (IPMI) sensors for the computing fan subsystem that is configured to cool the computing device associated with the fan management subsystem and disabling second IPMI sensors for the others of the plurality of computing fan subsystems.

20. The method of claim 14, wherein the fan management subsystem is provided by a remote access controller device that is included in the computing device associated with the fan management subsystem.

* * * * *